United States Patent
Cheng

(10) Patent No.: US 8,368,227 B2
(45) Date of Patent: Feb. 5, 2013

(54) SEMICONDUCTOR ELEMENT AND PACKAGE HAVING SEMICONDUCTOR ELEMENT

(75) Inventor: Bin-Hong Cheng, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 113 days.

(21) Appl. No.: 12/796,293

(22) Filed: Jun. 8, 2010

(65) Prior Publication Data

US 2011/0156267 A1  Jun. 30, 2011

(30) Foreign Application Priority Data

Dec. 29, 2009  (TW) ................... 98145578 A

(51) Int. Cl.
*H01L 25/16* (2006.01)
*H01L 21/50* (2006.01)

(52) U.S. Cl. ......... 257/774; 257/E23.011; 257/E21.597; 257/E21.503; 257/E23.023; 257/667; 257/773; 257/697; 257/698; 257/752; 257/738; 257/688

(58) Field of Classification Search .......... 257/774, 257/E21.597, E23.011, 773, 688, 697, 698, 257/752, E21.503, 738, E23.023
See application file for complete search history.

(56) References Cited

U.S. PATENT DOCUMENTS

| | | | | |
|---|---|---|---|---|
| 4,194,283 A | * | 3/1980 | Hoffmann | 438/239 |
| 6,239,026 B1 | * | 5/2001 | Liu et al. | 438/637 |
| 6,921,718 B2 | * | 7/2005 | Andoh et al. | 438/699 |
| 7,528,480 B2 | * | 5/2009 | Mihara | 257/700 |
| 7,687,916 B2 | * | 3/2010 | Lake | 257/773 |
| 2008/0150089 A1 | * | 6/2008 | Kwon et al. | 257/621 |
| 2009/0243047 A1 | | 10/2009 | Wolter et al. | |
| 2010/0047963 A1 | * | 2/2010 | Wang et al. | 438/107 |
| 2010/0090318 A1 | * | 4/2010 | Hsu et al. | 257/621 |
| 2010/0090319 A1 | * | 4/2010 | Hsu et al. | 257/621 |
| 2010/0140805 A1 | * | 6/2010 | Chang et al. | 257/773 |
| 2011/0156268 A1 | * | 6/2011 | Cheng | 257/774 |
| 2012/0049358 A1 | * | 3/2012 | Cheng | 257/738 |
| 2012/0086122 A1 | * | 4/2012 | Cheng et al. | 257/738 |

OTHER PUBLICATIONS

SIPO Office Action with translation summary, dated Jan. 31, 2012, for Chinese Patent Application No. 201010119964.X (5 pages).

* cited by examiner

*Primary Examiner* — A O Williams
(74) *Attorney, Agent, or Firm* — McCracken & Frank LLC

(57) ABSTRACT

The present disclosure relates to a semiconductor process, a semiconductor element and a package having a semiconductor element. The semiconductor element includes a base material and at least one through via structure. The base material has a first surface, a second surface, at least one groove and at least one foundation. The groove opens at the first surface, and the foundation is disposed on the first surface. The through via structure is disposed in the groove of the base material, and protrudes from the first surface of the base material. The foundation surrounds the through via structure. Whereby, the foundation increases the strength of the through via structure, and prevents the through via structure from cracking.

16 Claims, 12 Drawing Sheets

__US 8,368,227 B2__

SEMICONDUCTOR ELEMENT AND PACKAGE HAVING SEMICONDUCTOR ELEMENT

BACKGROUND OF THE INVENTION

1. Field of the Invention

The present invention relates to a semiconductor process, a semiconductor element and package having the semiconductor element, and more particularly, to a semiconductor process, a semiconductor element and package having the semiconductor element that can increases the strength of the through via structure.

2. Description of the Related Art

FIG. 1 shows a cross-sectional view of a conventional semiconductor element. FIG. 2 shows a partial enlarged view of FIG. 1. As shown in FIG. 1 and FIG. 2, the conventional semiconductor element 1 comprises a base material 11, a passivation layer 12, at least one electrical device 13, at least one through via structure 14 and a redistribution layer 15. The base material 11 has a first surface 111, a second surface 112 and at least one groove 113. The groove 113 opens at the first surface 111. The passivation layer 12 is located on the first surface 111.

The electrical device 13 is disposed in the base material 11 and exposed on the second surface 112 of the base material 11. The through via structure 14 is disposed in the groove 113 and protrudes from the first surface 111. The through via structure 14 and the interface (the first surface 111) of the base material 11 forms an angle of 90 degrees. The redistribution layer 15 is disposed on the passivation layer 12 and electrically connected to the through via structure 14.

The conventional semiconductor element 1 has following defects. Since the through via structure 14 and the interface (the first surface 111) of the base material 11 forms an angle of 90 degrees, the through via structure 14 bears the greatest stress, so that the through via structure 14 is easy to crack when an external force or thermal energy is applied thereto.

Consequently, there is an existing need for a semiconductor process, a semiconductor element and package having the semiconductor element that solves the above-mentioned problems.

SUMMARY OF THE INVENTION

The present invention further provides a semiconductor element. The semiconductor element comprises a base material and at least one through via structure. The base material has a first surface, a second surface opposite the first surface, at least one groove and at least one foundation, the groove opens at the first surface, and the foundation is located on the first surface. The foundation extends upwards from the first surface, and the material of the foundation is the same as that of the base material. The through via structure is disposed in the groove and protrudes from the first surface, wherein the foundation surrounds the through via structure.

The present invention further provides a package having a semiconductor element. The package comprises a substrate, a semiconductor element, a chip and a protective material. The semiconductor element is disposed on the substrate and comprises a base material and at least one through via structure. The base material has a first surface, a second surface opposite the first surface, at least one groove and at least one foundation. The groove opens at the first surface, and the foundation is located on the first surface. The through via structure is disposed in the groove and protrudes from the first surface, wherein the foundation surrounds the through via structure. The chip is disposed on the semiconductor element. The protective material is disposed on the substrate and encapsulates the semiconductor element and the chip.

Whereby, the foundation increases the strength of the through via structure, and prevents the through via structure from cracking.

DETAILED DESCRIPTION OF THE INVENTION

Figure 3:
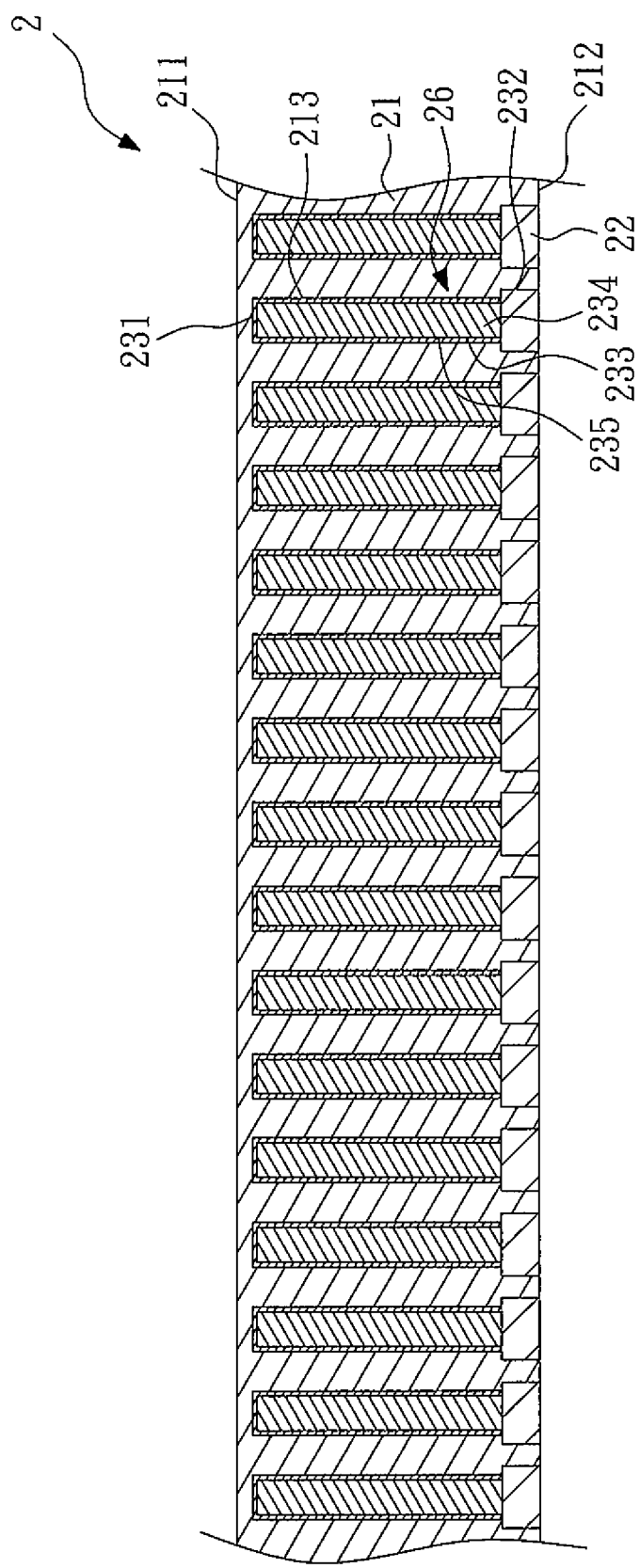
FIGS. 3-9 show the schematic views of the semiconductor process of the present invention.

FIGS. 3-9 show the schematic views of the semiconductor process of the present invention. As shown in FIG. 3, a semiconductor element 2 is provided. The semiconductor element 2 includes a base material 21 and at least one conductive via structure 26. In this embodiment, the semiconductor element 2 is a wafer and may further include at least one electrical device 22. The base material 21 has a top surface 211, a second surface 212 opposite the top surface 211 and at least one groove 213. In this embodiment, the base material 21 is made of silicon, and the top surface 211 is a (100) plane. The electrical device 22 is disposed in the base material 21 and exposed on the second surface 212 of the base material 21. In this embodiment, the electrical device 22 is a complementary metal-oxide-semiconductor (CMOS).

The conductive via structure 26 is disposed in the groove 213 and has a first end 231 and a second end 232. The second end 232 is connected to the electrical device 22, and the conductive via structure 26 does not penetrate through the base material 21; that is, the first end 231 of the conductive via structure 26 does not be exposed on the top surface 211 of the base material 21. In this embodiment, the conductive via structure 26 comprises an outer insulation layer 233 and a conductor 234. The outer insulation layer 233 is disposed on the side wall and the first end 231 of the groove 213 to define a second central groove 235, and the second central groove 235 is filled with the conductor 234. The conductor 234 of the conductive via structure 26 is made of copper.

Figure 4:
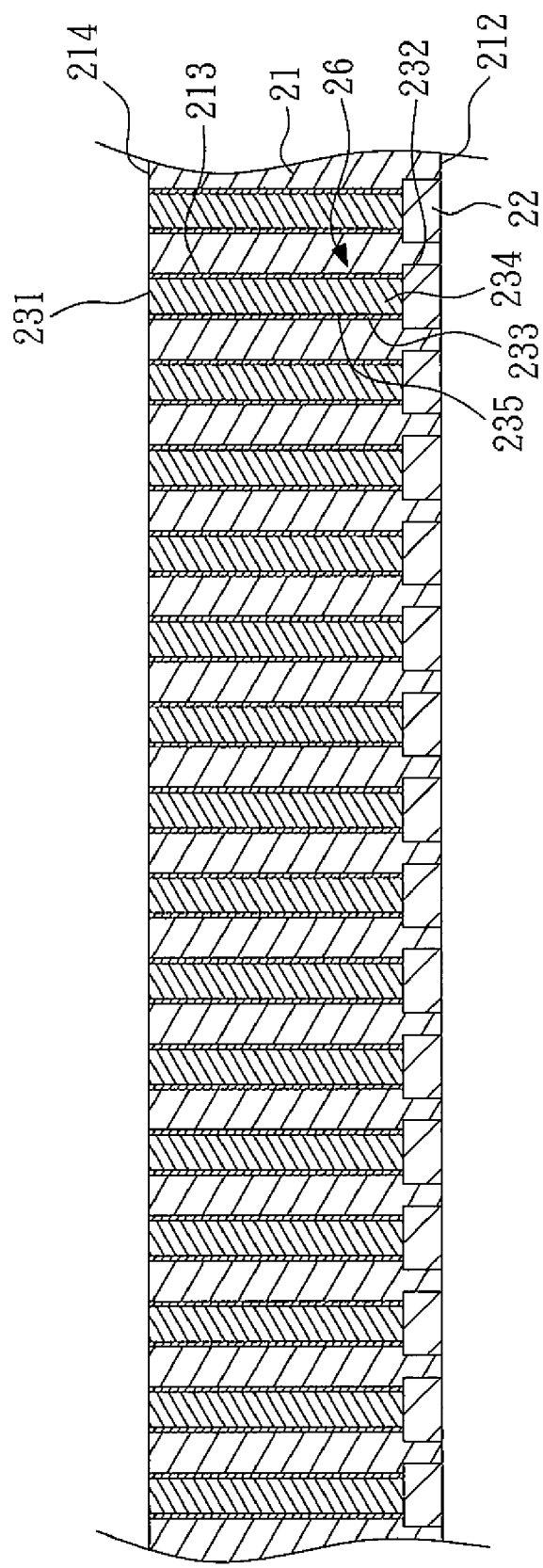
Figure 10:
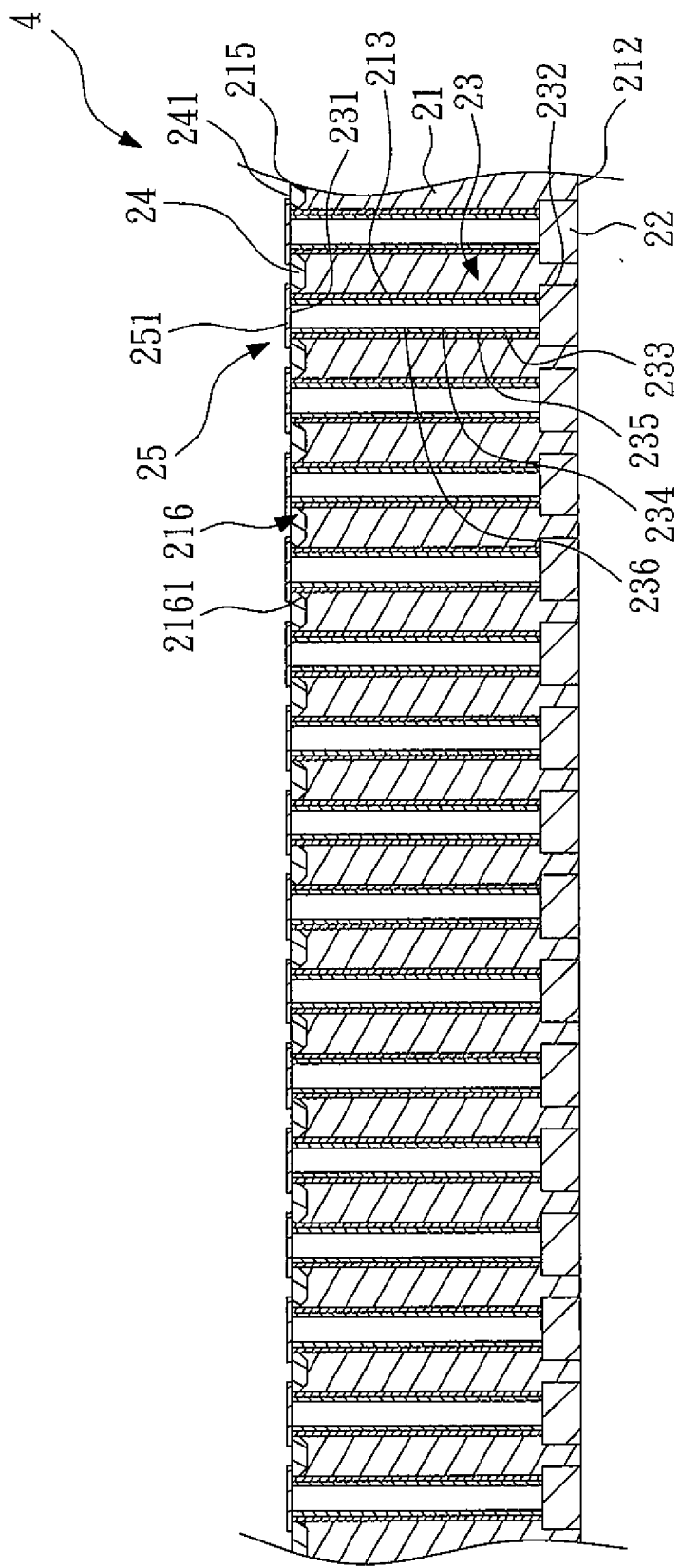
FIG. 10 shows a cross-sectional view of a semiconductor element according to a second embodiment of the present invention.

However, in other embodiments, the second central groove 235 is not filled with the conductor 234, and the conductor 234 is disposed on the side wall of the second central groove 235, so as to define a first central groove 236 (FIG. 10). Alternatively, the conductive via structure 26 can further comprise an inner insulation layer 237 (FIG. 11) with which the first central groove 236 is filled. As shown in FIG. 4, part of the base material 21 is removed by grinding the top surface 211 to form a third surface 214, wherein the conductive via structure 26 is exposed on the third surface 214. Preferably, the first end 231 of the conductive via structure 26 is exposed on the third surface 214 of the base material 21.

Figure 5:
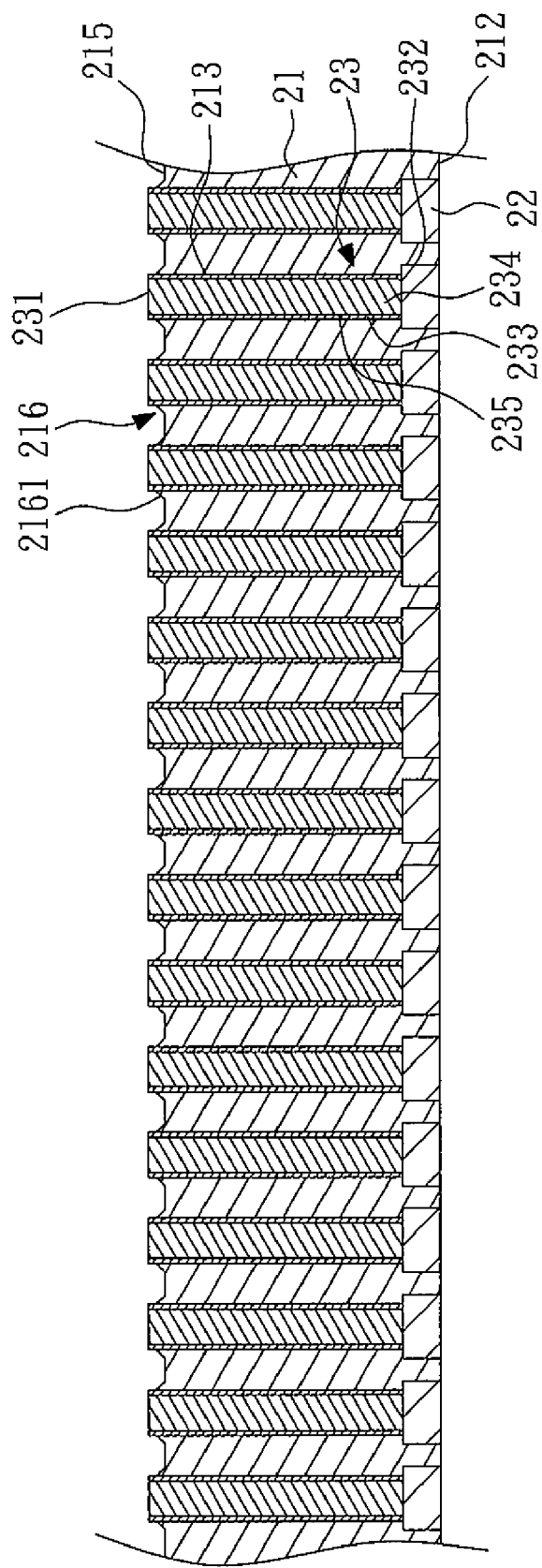

As shown in FIG. 5, part of the base material 21 is removed from a side corresponding to the top surface 211 of the base material 21 by using an anisotropic etchant (not shown). In this embodiment, part of the base material 21 is removed from the third surface 214 of the base material 21, to form a first surface 215 and at least one foundation 216, so that the groove 213 opens at the first surface 215, the conductive via structure 26 (FIG. 4) protrudes from the first surface 215 of the base material 21 so as to form a through via structure 23, and the foundation 216 is located on the first surface 215 and surrounds the through via structure 23. That is, the foundation 216 extends upwards from the first surface 215, and the material of the foundation 216 is the same as that of the base material 21.

Figure 1:
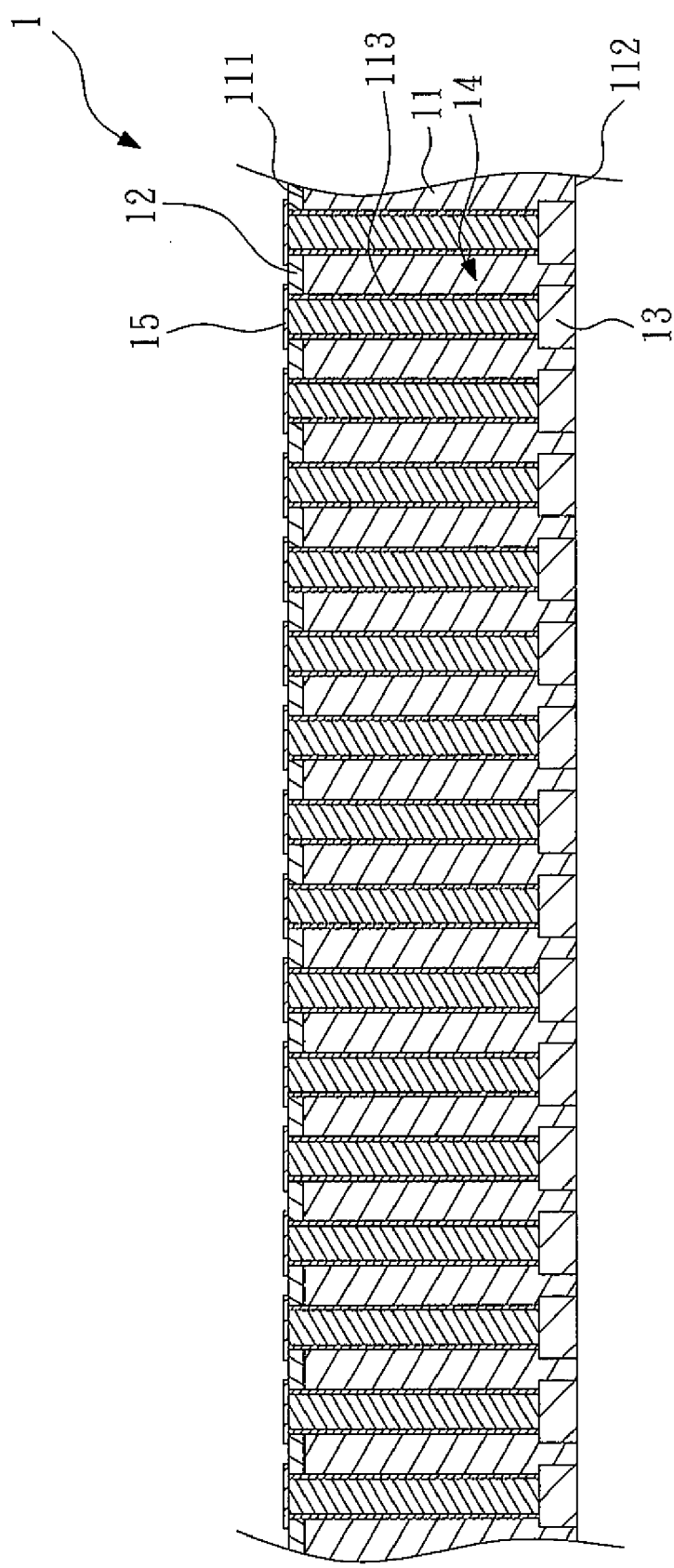
FIG. 1 shows a cross-sectional view of a conventional semiconductor element.
Figure 2:
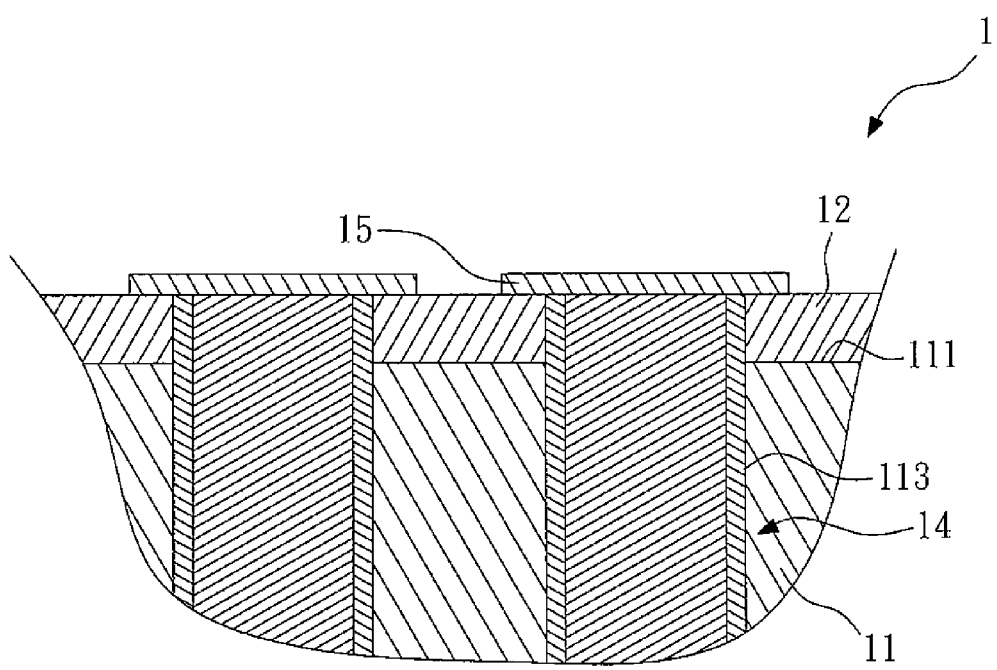
FIG. 2 shows a partial enlarged view of FIG. 1.
Figure 9:
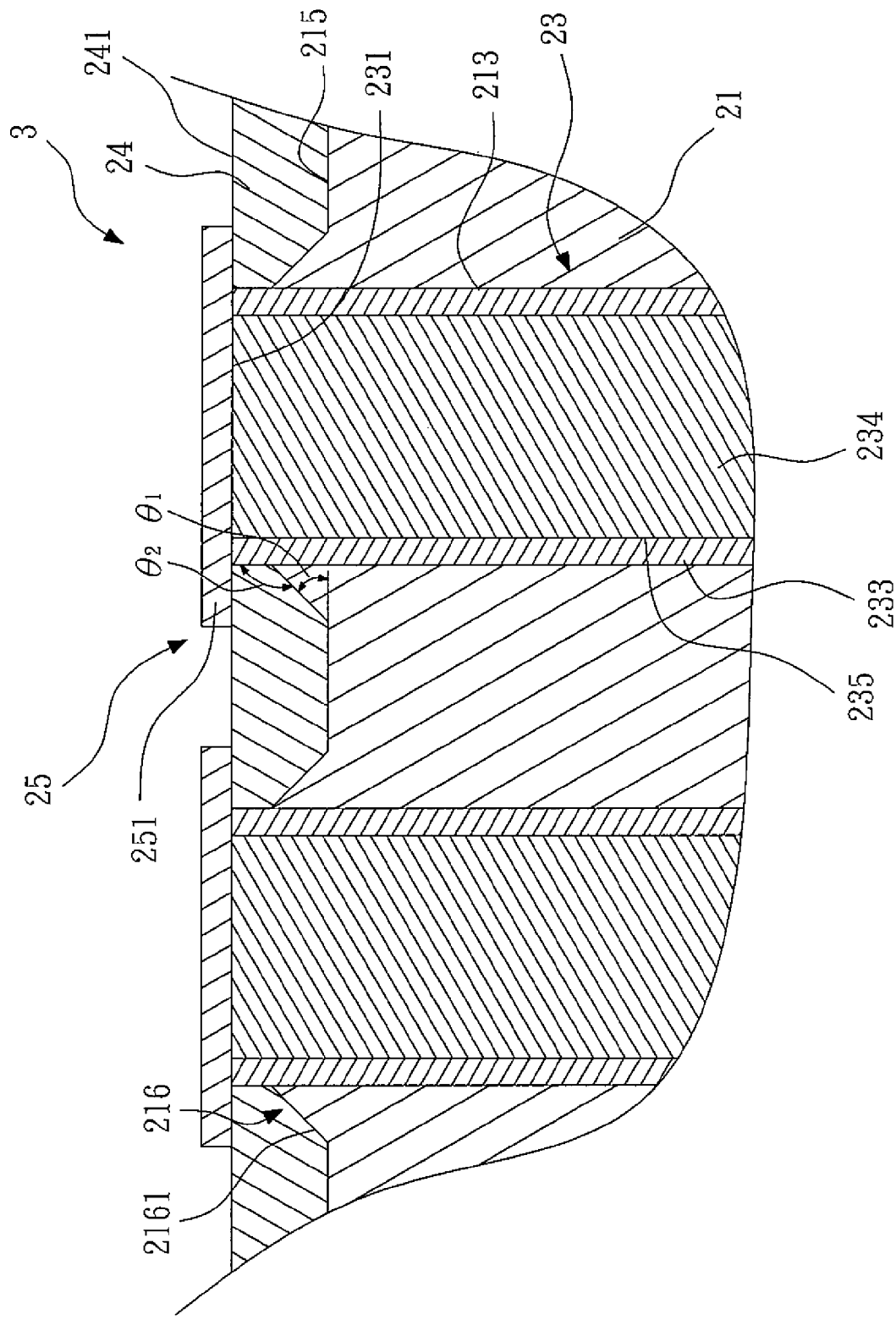

In this embodiment, the anisotropic etchant is TMAH (tetramethylammonium hydroxide, $(CH_3)_4NOH$). Since the TMAH etching rate is strongly effected by the lattice orientation of the silicon, it shows an anisotropic etching result. When the top surface 211 of the base material 21 (made of silicon) is a (100) plane, the foundation 216 is formed. However, when the top surface 211 of the base material 21 (made of silicon) is (111) plane, it shows a result similar to that in FIG. 1. In this embodiment, the foundation 216 has a periphery surface 2161, and the periphery surface 2161 is (111) plane. According to the material characteristics of silicon, the periphery surface 2161 and the first surface 215 forms an included angle $\theta_1$ of 45 degrees (FIG. 9), and thus the periphery surface 2161 and the through via structure 23 forms an included angle $\theta_2$ of 135 degrees (FIG. 9). The height of the foundation 216 is less than a distance which the through via structure 23 protrudes from the first surface 215.

Figure 6:
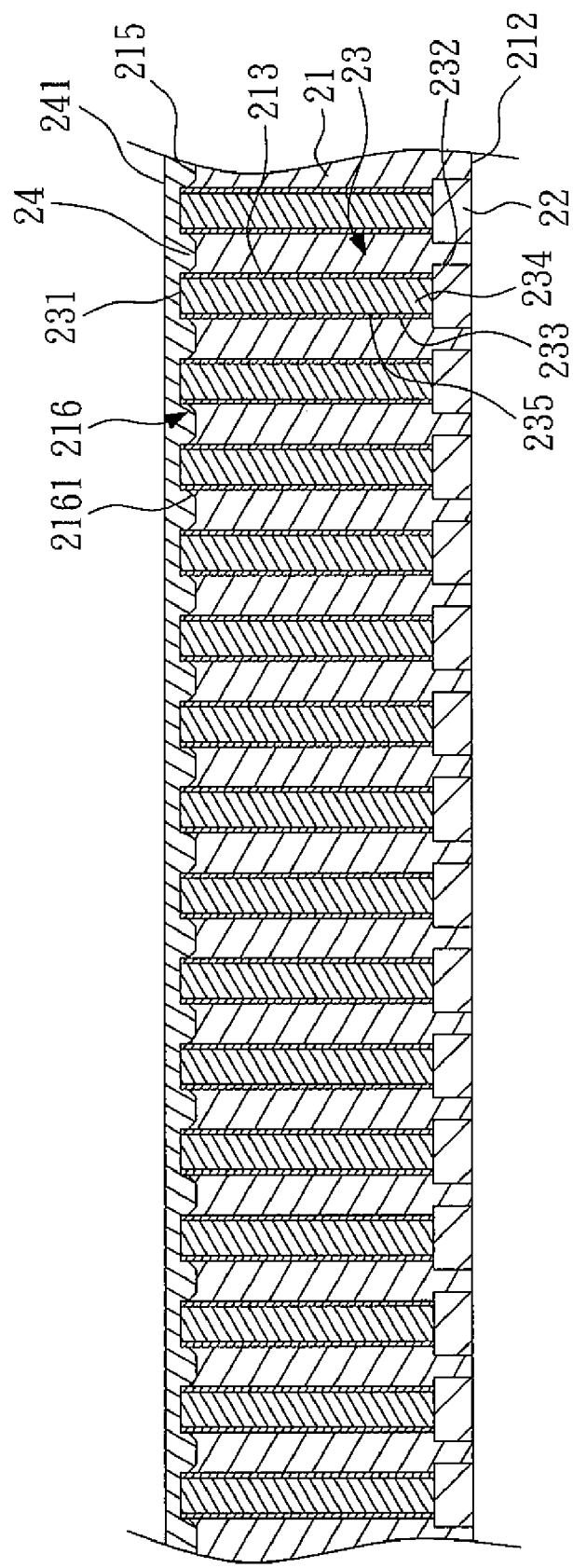
Figure 7:
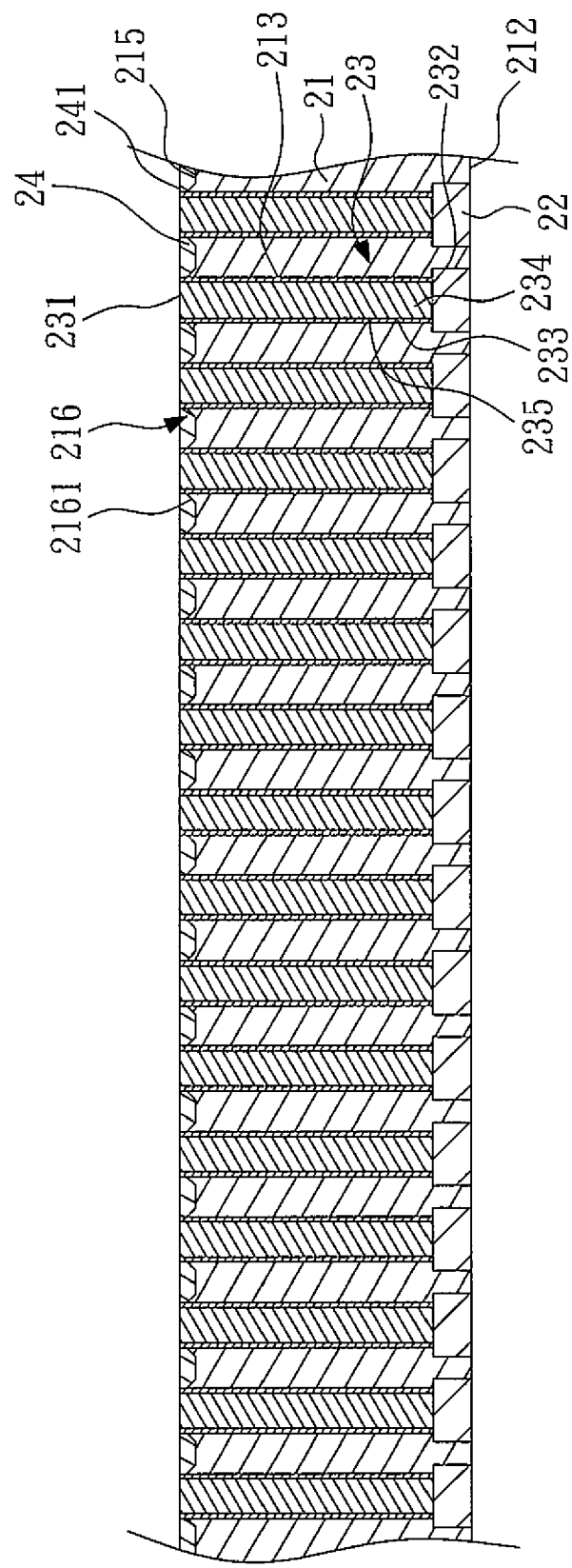
Figure 8:
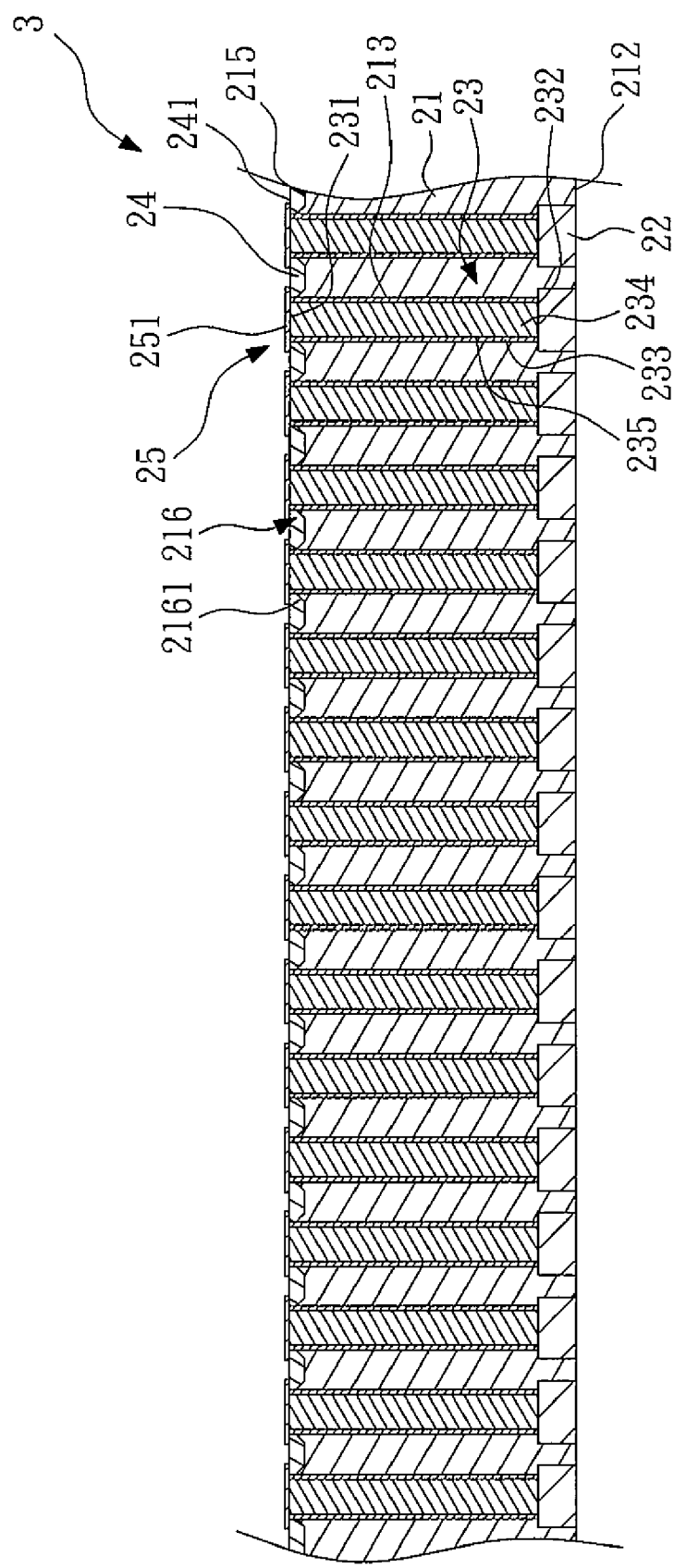

As shown in FIG. 6, a protective layer 24 is disposed on the first surface 215 of the base material 21, to cover the exposed first end 231 of the through via structure 23, wherein the protective layer 24 has a surface 241. As shown in FIG. 7, part of the protective layer 24 is removed, so as to expose the first end 231 of the through via structure 23 on the surface 241. In this embodiment, part of the protective layer 24 is removed by an etching method or a grinding method. As shown in FIG. 8, in this embodiment, a redistribution layer (RDL) 25 can further be formed on the surface 241 of the protective layer 24, and a semiconductor element 3 according to a first embodiment of the present invention is manufactured. The redistribution layer 25 comprises at least on electrically-connected region 251 which is connected to the first end 231 of the through via structure 23.

Referring to FIGS. 8 and 9, a cross-sectional view of the semiconductor element according to the first embodiment of the present invention and its partial enlarged view are shown. The semiconductor element 3 comprises a base material 21 and at least one through via structure 23. In this embodiment, the base material 21 is a wafer and further comprises a protective layer 24, at least one electrical device 22 and a redistribution layer 25. The base material 21 has a first surface 215, a second surface 212 opposite the first surface 215, at least one groove 213 and at least one foundation 216. The groove 213 opens at the first surface 215, and the foundation 216 is located on the first surface 215. In this embodiment, the base material 21 is made of silicon, and the first surface 215 of the base material 21 is a (100) plane. The foundation 216 has a periphery surface 2161, and the periphery surface 2161 and the through via structure 23 forms an included angle of 135 degrees. The height of the foundation 216 is less than a distance which the through via structure 23 protrudes from the first surface 215.

The protective layer 24 is disposed on the first surface 215 of the base material 21 and has a surface 241. The electrical device 22 is disposed in the base material 21 and exposed on the second surface 212 of the base material 21. In this embodiment, the electrical device 22 is a complementary metal-oxide-semiconductor (CMOS). The through via structure 23 is disposed in the groove 213 and protrudes from the first surface 215 of the base material 21. The foundation 216 surrounds the through via structure 23. The through via structure 23 has a first end 231 and a second end 232, wherein the first end 231 protrudes from the surface 241 of the protective layer 24, and the second end 232 is connected to the electrical device 22. A ratio of a height of the foundation 216 to a distance of the first end 231 protrudes from the surface 241 should be in the range of 10%~75%. Preferably, should be in the range of 20%~60%. In this embodiment, the through via structure 23 comprises an outer insulation layer 233 and a conductor 234. The outer insulation layer 233 is disposed on the side wall of the groove 213 to define a second central groove 235, and the second central groove 235 is filled with the conductor 234. The conductor 234 of the through via structure 23 is made of copper.

Figure 11:
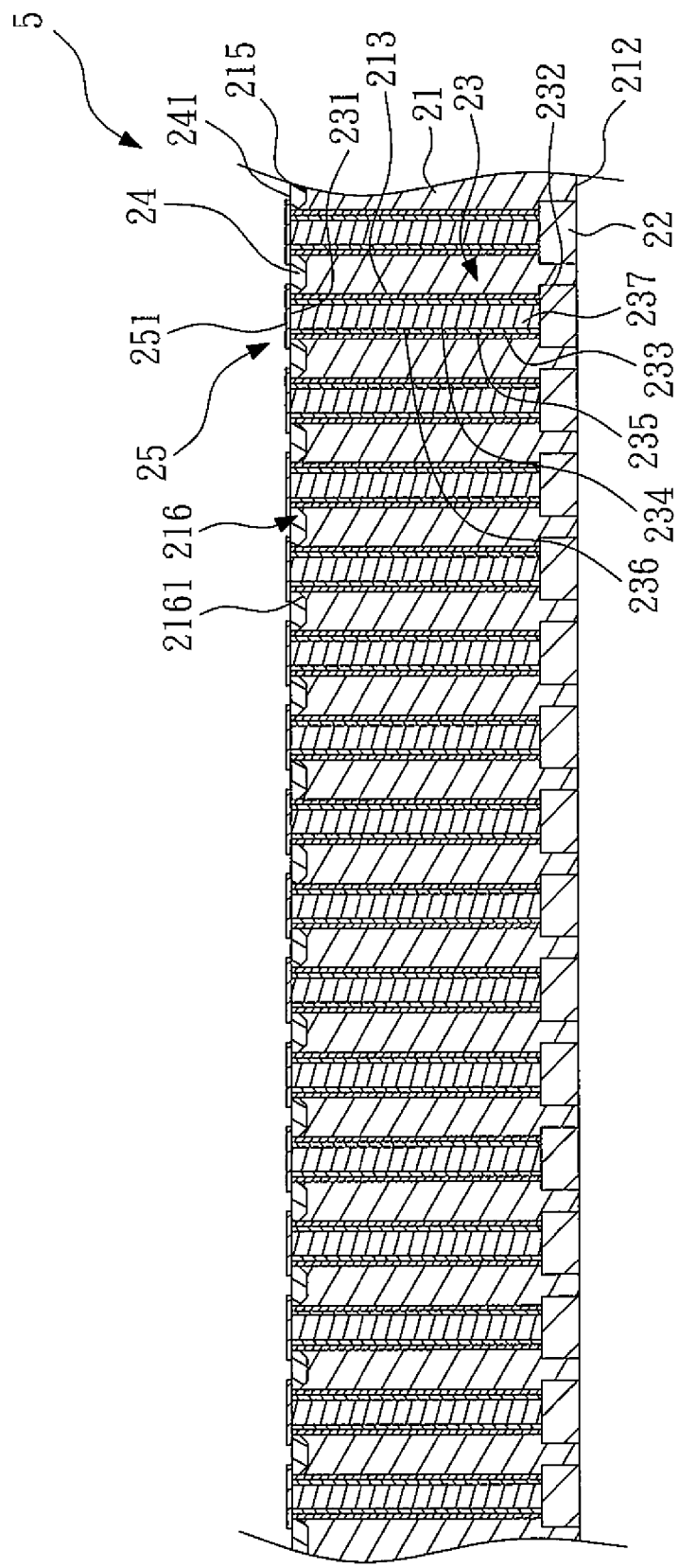
FIG. 11 shows a cross-sectional view of a semiconductor element according to a third embodiment of the present invention.

As shown in FIG. 10, a semiconductor element 4 according to a second embodiment of the present invention, the second central groove 235 is not filled with the conductor 234, and the conductor 234 is disposed on the side wall of the second central groove 235, so as to define a first central groove 236. Alternatively, as shown in FIG. 11, a semiconductor element 5 according to a third embodiment of the present invention, the through via structure 23 can further comprise an inner insulation layer 237 with which the first central groove 236 is filled. The redistribution layer 25 is disposed on the surface 241 of the protective layer 24 and comprises at least on electrically-connected region 251 which is connected to the first end 231 of the through via structure 23.

Whereby, the foundation 216 increases the strength of the through via structure 23, and prevents the through via structure 23 from cracking.

Figure 12:
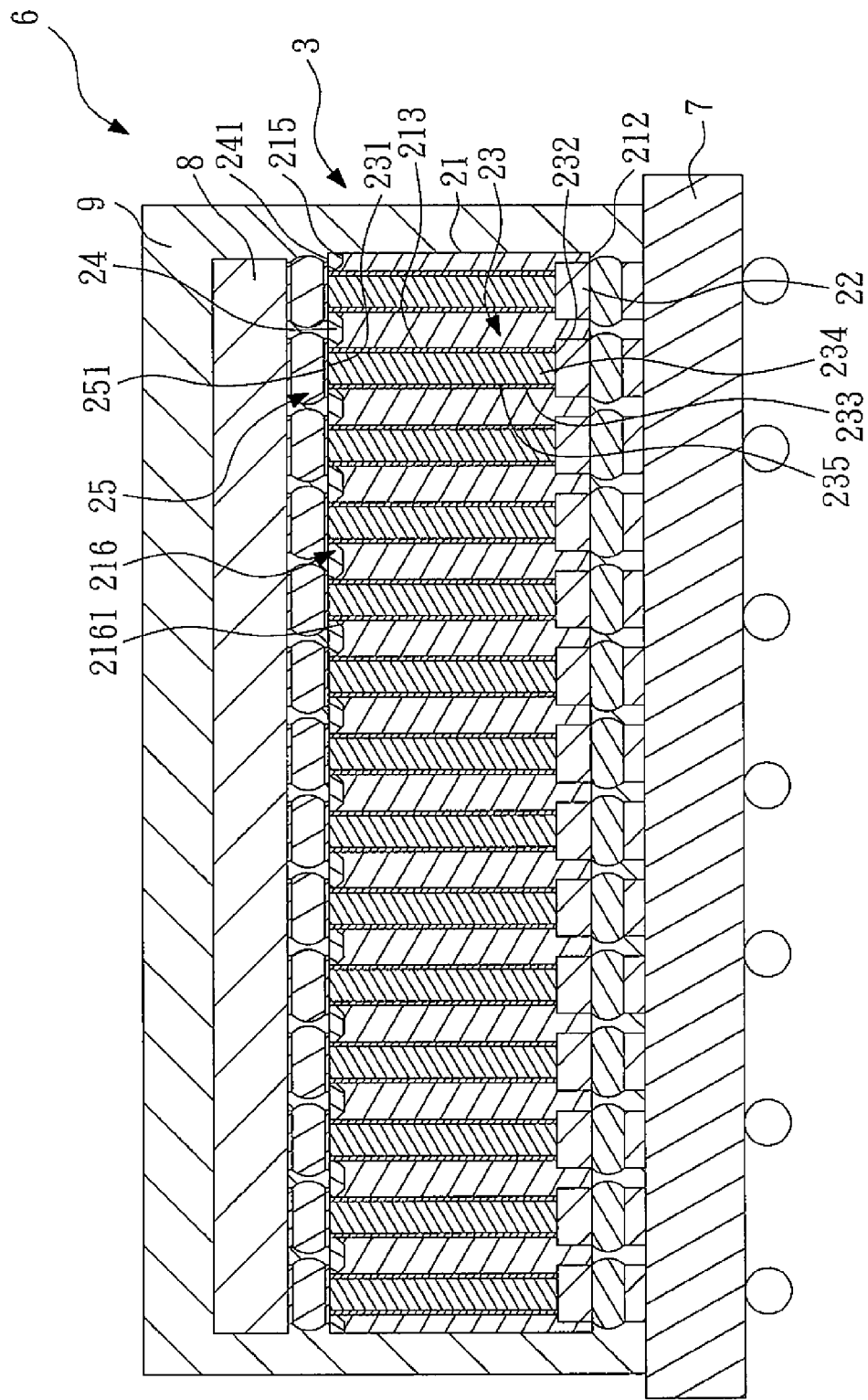
FIG. 12 shows a cross-sectional view of a package having a semiconductor element of the present invention.

FIG. 12 shows a cross-sectional view of a package having a semiconductor element of the present invention. As shown in FIG. 12, the package 6 comprises a substrate 7, a semiconductor element, a chip 8 and a protective material 9. The semiconductor element is the semiconductor element 3 according to the first embodiment of the present invention. It should be noted that in other embodiments, the semiconductor element can be the semiconductor element 4 according to the second embodiment or the semiconductor element 5 according to the third embodiment of the present invention. The chip 8 is disposed on the semiconductor element. The protective material 9 is disposed on the substrate 7 and encapsulates the semiconductor element and the chip 8.

While embodiments of the present invention have been illustrated and described, various modifications and improvements can be made by those skilled in the art. The embodiments of the present invention are therefore described in an illustrative but not restrictive sense. It is intended that the present invention is not limited to the particular forms illustrated, and that all modifications that maintain the spirit and scope of the present invention are within the scope defined in the appended claims.

What is claimed is:

1. A semiconductor element, comprising:
    a base material, having a first surface, a second surface opposite the first surface, at least one groove and at least one foundation, the groove having an opening at the first surface, and the foundation being located on the first surface, wherein the foundation extends upwards from the first surface, and the material of the foundation is the same as that of the base material; and
    at least one through via structure, disposed in the groove and protruding from the first surface, wherein the foundation surrounds the through via structure.

2. The semiconductor element according to claim 1, wherein the base material is made of silicon, and the first surface of the base material is a (100) plane.

3. The semiconductor element according to claim 1, wherein the foundation has a periphery surface, and the periphery surface and the through via structure forms an included angle of 135 degrees.

4. The semiconductor element according to claim 1, wherein a height of the foundation is less than a distance which the through via structure protrudes from the first surface.

5. The semiconductor element according to claim 4, wherein a ratio of the height of the foundation to the distance which the through via structure protrudes from the first surface is within 10%~75%.

6. The semiconductor element according to claim 1, wherein the through via structure comprises an outer insulation layer and a conductor, the outer insulation layer is disposed on the side wall of the groove to define a second central groove, and the conductor is disposed on the side wall of the second central groove to define a first central groove, and the first central groove is filled with the inner insulation layer.

7. The semiconductor element according to claim 1, wherein the through via structure comprises an outer insulation layer and a conductor, the outer insulation layer is disposed on the side wall of the groove to define a second central groove, and the second central groove is filled with the conductor.

8. A package having a semiconductor element, comprising:
a substrate;
a semiconductor element, disposed on the substrate, the semiconductor element comprising:
  a base material, having a first surface, a second surface opposite the first surface, at least one groove and at least one foundation, the groove having a opening at the first surface, and the foundation being located on the first surface; and
  at least one through via structure, disposed in the groove and protruding from the first surface, wherein the foundation surrounds the through via structure;
a chip, disposed on the semiconductor element; and
a protective material, disposed on the substrate and encapsulating the semiconductor element and the chip.

9. The package according to claim 8, wherein the base material is made of silicon, and the first surface of the base material is a (100) plane.

10. The package according to claim 8, wherein the foundation has a periphery surface, and the periphery surface and the through via structure forms an included angle of 135 degrees.

11. The package according to claim 8, wherein the foundation extends upwards from the first surface, and the material of the foundation is the same as that of the base material.

12. The package according to claim 8, wherein a height of the foundation is less than a distance which the through via structure protrudes from the first surface.

13. The package according to claim 8, wherein a ratio of the height of the foundation to the distance which the through via structure protrudes from the first surface is within 20%~60%.

14. The package according to claim 8, wherein the through via structure comprises an outer insulation layer and a conductor, the outer insulation layer is disposed on the side wall of the groove to define a second central groove, and the conductor is disposed on the side wall of the second central groove.

15. The package according to claim 8, wherein the through via structure comprises an outer insulation layer and a conductor, the outer insulation layer is disposed on the side wall of the groove to define a second central groove, and the second central groove is tilled with the conductor.

16. The package according to claim 8, wherein the through via structure comprises an outer insulation layer, a conductor and an inner insulation layer, the outer insulation layer is disposed on the side wall of the groove to define a second central groove, the conductor is disposed on the side wall of the second central groove to define a first central groove, and the first central groove is filled with the inner insulation layer.

* * * * *